US005637521A

United States Patent [19]

Rhodes et al.

[11] Patent Number: 5,637,521

[45] Date of Patent: Jun. 10, 1997

[54] METHOD OF FABRICATING AN AIR-FILLED WAVEGUIDE ON A SEMICONDUCTOR BODY

[75] Inventors: David L. Rhodes, Brick; Xiaojia J. Lu, Nutley; Dwight L. Woolard, Neptune, all of N.J.

[73] Assignee: The United States of America as represented by the Secretary of the Army, Washington, D.C.

[21] Appl. No.: 665,138

[22] Filed: Jun. 14, 1996

[51] Int. Cl.$^{6}$ .............................................. H01L 21/283

[52] U.S. Cl. .............................................. 438/619; 438/106

[58] Field of Search .............................. 437/51, 789, 204, 437/927, 974; 148/DIG. 12

[56] References Cited

U.S. PATENT DOCUMENTS 5,016,083 5/1991 Ishii et al. .

5,045,820 9/1991 Leicht et al. .............................. 333/26

5,249,245 9/1993 Lebby et al. .............................. 385/89

5,376,574 12/1994 Peterson .................................... 437/51

5,453,154 9/1995 Thomas et al. ............................ 216/18

OTHER PUBLICATIONS

Wolf., S., et al., Silicon Processing, Lattice Press, 1986, vol. 1, pp. 407–409, 427–446.

*Primary Examiner*—T. N. Quach

*Attorney, Agent, or Firm*—Michael Zelenka; William H. Anderson

[57] ABSTRACT

A method of using layers of gold metallization and a thick film coating of photo-sensitive material to form an air-filled microwave waveguide structure on the outer surface of a semiconductor body, such as a monolithic microwave integrated circuit commonly referred to as an MMIC, so that the waveguide can be coupled to the active and passive devices of the MMIC. First, a patterned metallization layer is formed on a substrate. A mold of a waveguide is fabricated by masking and then etching another metallization layer. The mold is turned over face down on the patterned metallization layer and bonded to the patterned metallization layer, Then, any unnecessary material is etched away.

6 Claims, 2 Drawing Sheets

METHOD OF FABRICATING AN AIR-FILLED WAVEGUIDE ON A SEMICONDUCTOR BODY

GOVERNMENT INTEREST

This invention was made by employees of the U.S. Government and therefore may be made, sold, licensed, imported and used by or for the Government of the U.S. of America without the payment of any royalties thereon or therefor.

BACKGROUND OF THE INVENTION

1. Field of the Invention

This invention relates generally to microwave and micro-electronic apparatus and more particularly to a lowloss waveguide structure located directly over an integrated circuit structure such as a monolithic microwave integrated circuit (MMIC).

2. Description of Related Art

Current integrated circuit designs use either microstrip, stripline or coplanar configurations to interconnect devices and circuit elements. Such lines are also used as a means to provide various passive functions such as filtering. Despite their widespread application, they suffer higher loss and dispersion than a generally rectangular waveguide, particularly at microwave frequencies in the GHz range. This is due to the loss tangent of the substrate material, e.g. gallium arsenide, at such frequencies. Insofar as miniature size waveguides for use above 100 GHz is concerned, fabrication of such structures is conventionally achieved mechanically such as by micromachining. This is not only time consuming, but also costly and difficult to implement particularly where active and passive devices need to be incorporated therewith.

SUMMARY

Accordingly, it is a primary object of the present invention to provide a method of fabricating a waveguide structure on a semiconductor body.

It is another object of the invention to provide a method of fabricating a waveguide on a semiconductor wafer or chip in a relatively simple and straight forward manner.

And it is a further object of the invention to provide a method of fabricating a waveguide on an integrated circuit structure which obviates the process of sophisticated machining while being compatible with conventional integrated circuit fabrication.

And it is still another object of the invention to provide a method of fabricating a miniature waveguide on a monolithic microwave integrated circuit (MMIC) so that it can be combined with active devices of the integrated circuit.

These and other objects are fulfilled by a method which uses metallization and a thick film coating applied to an outer surface of a semiconductor body including an integrated circuit device, e.g. a monolithic microwave integrated circuit (MMIC) to form the walls of a waveguide so that it can be coupled to the active and passive devices of the MMIC.

A preferred method of fabrication involves the steps of: forming a top layer of metallization, typically gold, on the device for acting as the bottom wall or floor of the waveguide; forming a photo-sensitive thick film coating, such as a polymer or a polyimide spin-on coating, over the top layer of metallization for defining the top planar profile of the waveguide structure such as by using an ultraviolet mask and exposure technique; removing the portion of the film not defining the waveguide such as by washing away the uncured portion of the polymer/polyimide layer using a developer; forming a second layer of gold metallization over the remaining waveguide portion of the structure so as to form the top and side walls of the waveguide; and then removing the polymer/polyimide portion remaining inside the waveguide.

In an alternate embodiment, the waveguide is fabricated first by creating a mold in which a thick file layer of photo-sensitive polymer/polyimide is formed on a flat support element such as a board. A recess or slot defining the waveguide is then formed on the polyimide coated support member, for example, by utilizing an ultraviolet exposure process but now with a negative mask. This is followed by depositing a layer of gold film on the outer surface of the polyimide, after which the support member is turned over and placed on a semiconductor body including an integrated circuit device, such as a MMIC, which has also previously received a layer of gold metallization on the top surface thereof. The gold metal layer on the mold is then bonded to the layer of gold metallization on the MMIC, such as by soldering and hot pressing, whereupon the entire structure is immersed in a stripping solution to remove both the polyimide and the support element, while leaving a generally rectangular air-filled waveguide formed on the outer surface of the semiconductor body.

Further scope of applicability of the present invention will become apparent from the detailed description provided hereinafter. However, it should be understood that the detailed description and specific examples disclosed herein, while indicating the preferred embodiment and methods of the invention, are given by way of illustration only, and not limitation, since certain modifications and changes coming within the spirit and scope of the invention will become apparent to those skilled in the art from this detailed description.

BRIEF DESCRIPTION OF THE DRAWINGS

The present invention will become more fully understood from the following detailed description when considered together with the accompanying drawings wherein.

DETAILED DESCRIPTION OF THE INVENTION

Figure 1:
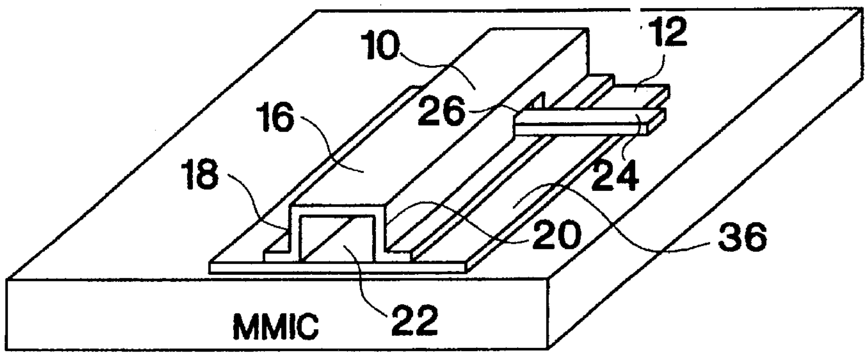
FIG. 1 is a perspective view generally illustrative of a micro-miniature waveguide formed on the outer surface of the semiconductor body including a monolithic microwave integrated circuit element.
Figure 2A:
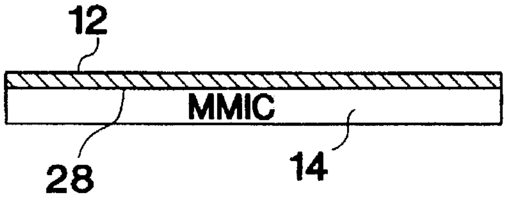
FIGS. 2(*a*)–2(*f*) are generally illustrative of the fabrication steps followed for fabricating a waveguide shown in FIG. 1 in accordance with a preferred method of the invention.
Figure 2B:
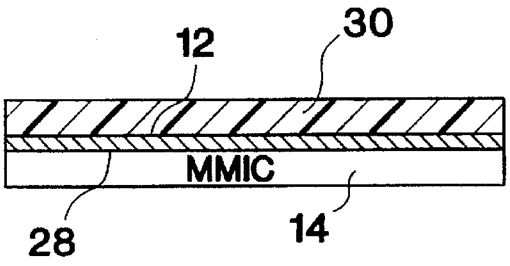
Figure 2C:
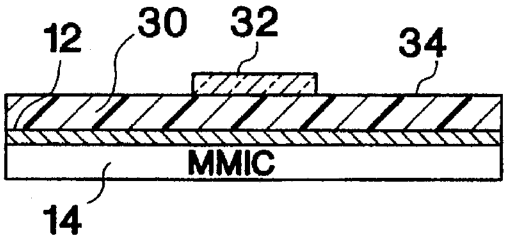
Figure 2D:
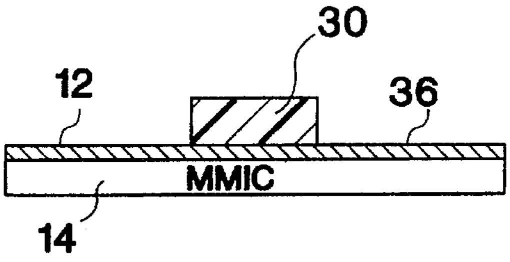
Figure 2E:
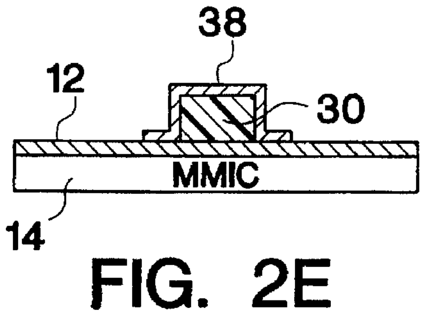
Figure 2F:
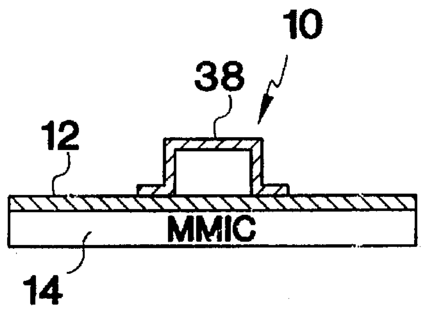
Figure 3A:
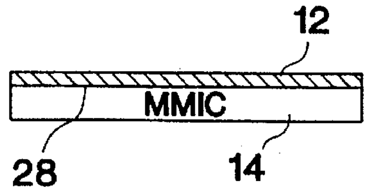
FIGS. 3(*a*)–3(*h*) are illustrative of the fabrication steps employed in an alternative method for fabricating a device shown in FIG. 1 in accordance with the subject invention.
Figure 3B:
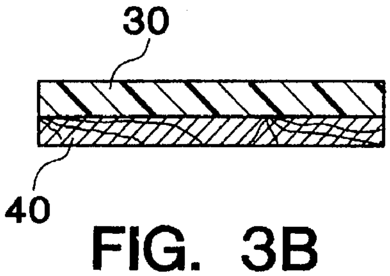
Figure 3C:
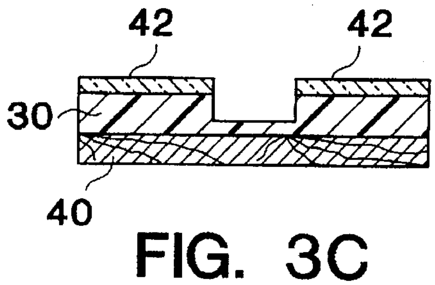
Figure 3D:
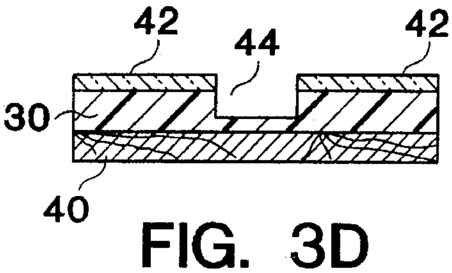
Figure 3E:
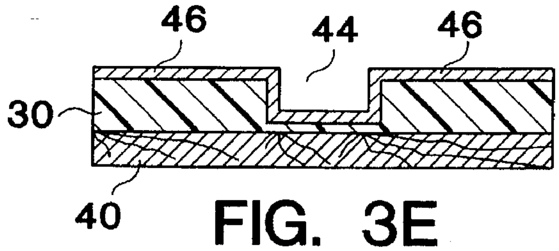
Figure 3F:
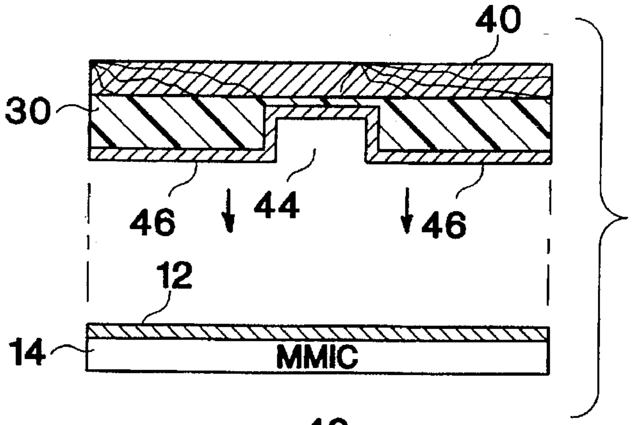
Figure 3G:
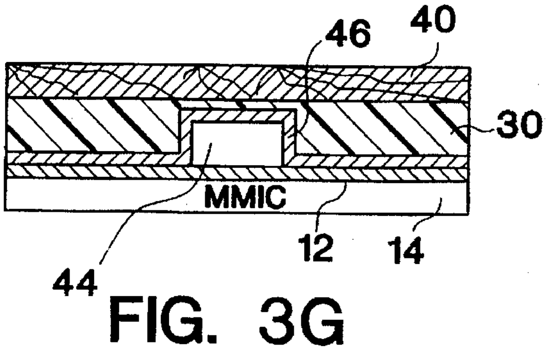
Figure 3H:
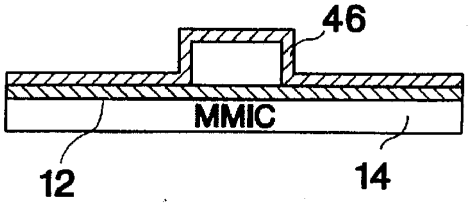

Referring now to the drawings and more particularly to FIG. 1, shown thereat is a generally rectangular waveguide 10 for translating microwave signals in the GHz ($1\times10^{-9}$ Hz) and THz ($1\times10^{-12}$ Hz) region of the electromagnetic spectrum and one which is located on an outer metallized surface 12 of a semiconductor body 14, e.g. wafer or chip, and more particularly a monolithic microwave integrated circuit (MMIC) including active and passive circuit elements, not shown, fabricated in a wafer of silicon or gallium arsenide (GaAs). As shown in FIG. 1, the waveguide structure 10 is generally rectangular in cross section and having raised top and side walls 16, 18 and 20, while the bottom wall comprises a portion of the metallized outer surface 12 and which is shown by reference numeral 22.

The purpose of the waveguide 10 is to provide efficient by-directional microwave signal flow between devices and microstrip or coplanar transmission lines, not shown, within the integrated circuit regime of the MMIC 14 and where coupling therebetween is typically provided by a coplanar or microstrip element which is shown in FIG. 1 by reference numeral 24 and which enters the waveguide 10, for example, via an opening 26 located in the waveguide sidewall 20. Due to the fact that loss between RF transmission elements is virtually eliminated, applications for such structure include the use of the waveguide structure 10 for various power combining techniques, interconnection between functional circuit modules with low loss and elimination of cross talk interference, low-noise receivers, detectors, mixers and sources.

Fabrication of the structure shown in FIG. 1 preferably involves a method as depicted in FIGS. 2(*a*)–2(*f*). The fabrication steps depicted thereat necessarily follow after the process(s), not shown, used to construct a MMIC in a semiconductor body 14 in accordance with known prior art techniques.

As shown, for example, in FIG. 2(*a*), the MMIC body 14 first has the layer of metallization 12, typically gold, formed on one outer surface 28 of the chip or wafer embodying the MMIC. This layer of metallization is achieved, for example, by vaporizing gold metal to a nominal thickness of, for example, 700Å and which is then patterned to define the shape of the waveguide 10 (FIG. 1) to be constructed thereat.

Following this, a thick film coating 30 of a photosensitive polymer or polyimide is formed over the layer of metallization 12 and the surface 28 as shown in FIG. 2(*b*). In the coating process, if the material is polyimide and is applied by a spin-on coating process, multiple spins may be necessary to reach the specified thickness or height as required for the particular waveguide structure 10 as determined by the height of the sidewalls 18 and 20. This height is predetermined by the operating frequency intended, the propagation mode, and the impedance desired. The coating material is then soft-baked at the temperature specified by the manufacturer.

Next, as shown in FIG. 2(*c*), a pattern 32 defining the top planar view of the waveguide structure 10 is fabricated on the upper surface 34 of the thick film coating 30 using a conventional ultraviolet (UV) masking and exposure technique including a contact exposure setup and a developer.

This is followed by the step shown in FIG. 2(*d*) where the unwanted portions of the thick film coating 30 are washed away, leaving an exposed portion of the coating which defines the shape and size of the resultant waveguide structure standing on the surface 36 of metallization 12.

Next as shown in FIG. 2(*e*), a second layer 38 of gold metallization is applied over both the first layer of metallization 12 and the portion of polymer coating 30 remaining after step 2(*d*). This second metallization includes two steps: (1) sputtering of gold to a nominal thickness of, for example, 200Å angstroms, and (2) increasing metal thickness slightly for improved durability by gold plating the sputtered gold to a nominal thickness of, for example, 10–15 μm.

Finally, the material 30 inside the waveguide 10 is removed as shown in FIG. 2(*f*) by immersing the chip 14 in a stripper solution, leaving an air-filled waveguide structure such as shown in FIG. 1.

The waveguide structure resulting from the foregoing method of fabrication while providing a much lower loss and less dispersive media is also immune to electromagnetic interference, line-to-line crosstalk/coupling and other stray coupling. The process enables the fabrication of almost rectangular waveguide on top of integrated circuit devices including a means for coupling between integrated circuit elements and the waveguide. Due to cut-off effects in waveguides, which must dimensionally conform with the integrated circuit, the process is particularly applicable for devices for transmitting signals above the 100 GHz frequency.

Alternatively, the waveguide structure 10 shown in FIG. 1 can also be fabricated in accordance with the steps shown in FIGS. 3(*a*)–3(*h*). As before, the first step shown in FIG. 3(*a*) involves forming a layer of gold metallization 12 on the top surface 28 of the semiconductor body 14 including an MMIC. Now, however, a mold is fabricated utilizing the steps shown in FIGS. 3(*b*)–3(*f*) .

In FIG. 3(*b*), a support element 40, which may be, for example, a circuit board element, is used to receive thereon the thick film coating 30 which is formed as described previously. Now, however, as shown in FIG. 3(*c*), an ultraviolet (UV) exposure process using a negative mask 42 fabricated on top of the thick film coating 30 results in an elongated cavity or slot 44 being formed conforming to the shape and size of the waveguide 10 (FIG. 1). This is shown in FIG. 3(*d*).

Following this, the masking is removed and a layer 46 of gold is deposited over the exposed surface of the coating 30 including the slot 44 as shown in FIG. 3(*e*). Next, as shown in FIG. 3(*f*), the resulting structure fabricated on the board 40 is flipped over and bonded to the top surface of the MMIC semiconductor body 14 including the first layer of gold metallization 12. Bonding can be achieved, for example, by soldering and/or hot pressing.

After the bonding process, the composite structure shown in FIG. 3(*g*) is then immersed in a solution of stripping agent for removing the board member 40 and the coating layer 30, leaving an air-filled waveguide configuration as shown in FIG. 3(*h*).

The methods of fabrication outlined above do not require sophisticated machining and are comparable with conventional integrated circuit fabrication. Since the waveguide is constructed on wafer/chip, it can be combined with the active devices of the integrated circuit, thus eliminating prohibitive labor costs, manually attempting to construct a similar environment, such as mounting devices inside a machine, miniature waveguide. It also provides an alternative routing path for intra-integrated signal routing.

The waveguide 10 can be operated in various ways similar to a conventional rectangular waveguide depending upon the application. For example, in a possible interconnection application, on one end of the waveguide is a mode launching device, not shown. The electromagnetic signal traveling down the waveguide is then picked up by another mode launching device or a detector, not shown, in the waveguide. The mode launching devices can be either metal posts or planar slot structures, with the active devices mounted either inside the waveguide or adjacent to it. Additionally, various leaky-wave antenna configurations can be achieved with the waveguide, including a simple open-end, not shown. Such antennas are bi-directional and can act either as transmitters or receptors, or both.

A 0.2 THz waveguide structure has been fabricated on a Duroid substrate using a photo-sensitive polyimide as a forming material, with photolithographic techniques being used to define a rectangular section, approximately 1 cm. long of the polyimide material on top of the substrate. A desired coating height of polyimide was formed to a thickness of 100 μm, where a 750 rpm spin-speed and 25 sec. spin-time were employed. The photosensitive polyimide was then imaged into a rectangular pattern using a UV light source mask aligner, with the unexposed portion of the polyimide being removed, using a developer such as porbimide 414 polyimide and QZ3301 developer manufactured by Olin Ciba-Giegy.

The invention being thus described, it will be obvious that the same may be varied in many ways. Such variations are not to be regarded as a departure from the spirit and scope of the invention, and all such modifications as would be obvious to one skilled in the art are intended to be included within the scope of the appended claims.

We claim:

1. A method of fabricating an air-filled waveguide on a semiconductor body, comprising the steps of:

(a) forming a patterned first layer of metallization on an outer surface of a semiconductor body;

(b) fabricating a mold of a waveguide on a support member by, (i) forming a relatively thick film coating of photo-sensitive material on said support member;

(ii) forming a mask on said coating, (iii) forming a cavity defining said waveguide in an unmasked portion of said coating, (iv) forming a second layer of metallization in said cavity and on said coating, (c) turning the mold over and locating it face down on said patterned first layer of metallization;

(d) bonding said first and second layers of metallization together; and (e) removing said support member and said thick film coating, thereby leaving an air-filled waveguide formed on the outer surface of said semiconductor body.

2. A method according to claim 1 wherein said semiconductor body comprises a monolithic microwave integrated circuit.

3. A method according to claim 2 wherein said steps (i) and (iii) of forming includes the step of photolithographically forming a negative mask of said coating and exposing said coating and mask with ultra-violet light.

4. A method according to claim 3 wherein said cavity comprises an elongated cavity having dimensions corresponding to the physical dimensions of said waveguide.

5. A method according to claim 2 wherein said thick film coating is comprised of a polymer or polyimide.

6. A method according to claim 1 wherein said first and second layers of metallization are comprised of gold.

* * * * *